United States Patent
Horng et al.

(10) Patent No.: US 8,048,692 B2
(45) Date of Patent: Nov. 1, 2011

(54) LED LIGHT EMITTER WITH HEAT SINK HOLDER AND METHOD FOR MANUFACTURING THE SAME

(75) Inventors: Ray-hua Horng, Taipei Hsien (TW); Dong-sing Wuu, Taipei Hsien (TW); Cheng-chung Chiang, Taipei Hsien (TW); Hsiang-yun Hsiao, Taipei Hsien (TW); Tsang-lin Hsu, Taipei Hsien (TW); Heng-I Lin, Taipei Hsien (TW)

(73) Assignee: Liung Feng Industrial Co., Ltd., Taipei Hsien (TW)

( * ) Notice: Subject to any disclaimer, the term of this patent is extended or adjusted under 35 U.S.C. 154(b) by 715 days.

(21) Appl. No.: 12/010,457

(22) Filed: Jan. 25, 2008

(65) Prior Publication Data

US 2009/0114934 A1    May 7, 2009

(30) Foreign Application Priority Data

Nov. 5, 2007  (TW) ............................... 96141685 A

(51) Int. Cl.
  *H01L 21/00* (2006.01)
  *H01L 23/34* (2006.01)

(52) U.S. Cl. .............. 438/22; 438/29; 257/720; 257/98; 257/99; 257/E21.001; 257/E21.51; 362/611

(58) Field of Classification Search ............... 257/79, 257/71, 82, 98, 95, 99, 100, 675, 678, 706, 257/720, E33.068, E33.071, E33.072, E33.075, 257/E21.001, E21.51; 362/611, 612; 438/22, 438/26, 25, 29, 39, 40, 455
See application file for complete search history.

(56) References Cited

U.S. PATENT DOCUMENTS

| | | | | |
|---|---|---|---|---|
| 5,886,811 | A  * | 3/1999 | Min ............................. | 359/291 |
| 6,583,444 | B2 * | 6/2003 | Fjelstad ........................ | 257/82 |
| 2006/0065941 | A1 * | 3/2006 | Delapierre ..................... | 257/414 |
| 2007/0111345 | A1 * | 5/2007 | Wong et al. ................... | 438/22 |
| 2008/0105887 | A1 * | 5/2008 | Narendran et al. ............ | 257/98 |

* cited by examiner

*Primary Examiner* — Colleen Matthews
*Assistant Examiner* — Galina Yushina
(74) *Attorney, Agent, or Firm* — Rosenberg, Klein & Lee

(57) ABSTRACT

An LED light emitter with heat sink holder and a method for manufacturing it are both disclosed. The LED light emitter with heat sink holder includes a heat sink holder and at least an LED chip. The heat sink holder is made of high thermal conductivity coefficient, and includes a reflecting mirror having a central portion and a reflecting portion surrounding the central portion. A normal of a top surface of the reflecting portion forms an acute angle relative to a normal of a top surface of the central portion. The LED chip is unitarily connected with a top surface of the central portion, and an electrode unit connecting with and Ohmic contacting the light emitting film for supplying power for the light emitting film. The LED light emitter with heat sink holder improves heat dissipation and working duration.

6 Claims, 4 Drawing Sheets

US 8,048,692 B2

LED LIGHT EMITTER WITH HEAT SINK HOLDER AND METHOD FOR MANUFACTURING THE SAME

BACKGROUND OF THE INVENTION

1. Field of the Invention

The present invention relates to a light emitter, and particularly to an LED light emitter including a light emitting diode (LED) chip and a heat sink holder, and as well as a method for manufacturing the same.

2. Related Art

As shown in FIG. 1, a conventional LED light emitter 1, in general, comprises a heat sink 11 having a recess 111 for dissipating heat, an LED chip 12 provided in the recess 111 for emitting light by photoemission, a connecting portion 13 (using the conducting paste, but the thermal conductivity coefficient of the paste is low) between a bottom of the recess 111 and the LED chip 12 for gluing the LED chip 12, and a transparent stuffing portion 14 stuffing the recess 111 for isolating the LED chip 12.

An electrode 121 connecting with the LED chip 12 electrically connects with an electrical connection wire (not shown) of an external circuit for providing the LED chip 12 with power. The most of light emitted by the LED chip 12 directly passes through the stuffing portion 14 to surroundings, and the little of light emitted by the LED chip 12 is reflected by sides of the recess 111 and passes through the stuffing portion 14. Heat generated by the LED chip 12 is let out through the connecting portion 13 and the heat sink holder 11, therefore avoiding heat within the LED chip 12 to influence recombination of electrons and holes, and shortening life of the light emitter 1.

The light emitter 1 is manufactured as follows. An LED chip 12 is provided firstly. The LED chip 12 and the connecting portion 13 are glued to the recess 111 of the heat sink holder 11. The stuffing portion 14 is filled in the recess 111.

The light emitter 1 is basically able to meet contemporary need. Its manufacture process is able to come into reality thanks to long-term semiconductor manufacturing and packaging, as well. But people are still endeavor to study and improve the light emitter 1. Such designs are shown in Taiwan Patent Nos. 095104637 and 095106043. The patent No. 095104637 discloses an insulted base between a substrate and a connecting portion for enhancing light luminance. The patent No. 095106043 discloses a static discharge prevention element packaged in an LED and a method for manufacturing it.

However, the conventional light emitter 1 includes an LED chip 12 glued by a connecting portion 13. Thermal conduction is subject to different thermal conduction coefficients of different layers and interfaces, and influences light emission and lifespan of the light emitter 1. On the other hand, during the connecting portion 13 is glued to the LED chip 12, the connecting portion 13 is apt to form voids because of piling and pressing, thus destroying interface of thermal conduction, seriously influencing heat dissipation of the light emitter 1, and shortening its life.

WIPO patent application No. WO2006112356A1 and Japanese patent application No. JP2006339542A both disclose a die directly bonded on a thermal circuit board for heat dissipation. However, this method requires material good at heat dissipation. Moreover, thermal size is just the contact size of the die, obstructing reduction of thermal resistance.

An LED light emitter with heat sink holder overcoming the defects above and a method for manufacturing it are desired.

SUMMARY OF THE INVENTION

Accordingly, a main object of the present invention is to provide an LED light emitter with heat sink holder, which speeds up thermal radiation of an LED chip thereof and which improves light emission of the LED chip and lengthens life thereof.

Another object of the present invention is to provide a method for manufacturing such an LED light emitter with heat sink holder.

To achieve the above objects, the LED light emitter with heat sink holder according to the present invention comprises a heat sink holder and at least an LED chip. The heat sink holder is made of material with high thermal conductivity coefficient, and includes a reflecting mirror having a central portion and a reflecting portion surrounding the central portion. A normal of a top surface of the reflecting portion forms an acute angle relative to a normal of a top surface of the central portion. The LED chip is unitarily connected with the top surface of the central portion, and includes a substrate unitarily connecting with the top surface of the central portion, a light emitting film on the substrate for emitting light by photoemission, and an electrode unit connecting with and Ohmic contacting the light emitting film for supplying power for the light emitting film.

According to another aspect of the present invention, a method for manufacturing an LED light emitter with heat sink holder comprises chip setting step, sacrificial layer forming step, heat sink holder forming step and sacrificial layer removing step. The chip setting step comprises putting and fixing an LED chip on a support portion in such a way that a light emitting film of the LED chip facing to the support portion. The LED chip includes a substrate, a light emitting film on the substrate for generating light by photoemission, and an electrode unit connecting with and Ohmic contacting the light emitting film for supplying power for the light emitting film. The sacrificial layer forming step comprises forming a removable sacrificial layer on the support portion and around a peripheral of the LED chip. Thickness of the sacrificial layer continuously reduces from a top of the LED chip to the support portion. The heat sink holder forming step comprises forming a heat sink holder from a bottom of the substrate of the LED chip to the sacrificial layer with material of high thermal conductivity coefficient. The heat sink holder has a top surface substantially parallel to a bottom surface of the substrate. The sacrificial layer removing step comprises removing the sacrificial layer to form the LED light emitter with heat sink holder.

DESCRIPTION OF THE PREFERRED EMBODIMENTS

Figure 2:
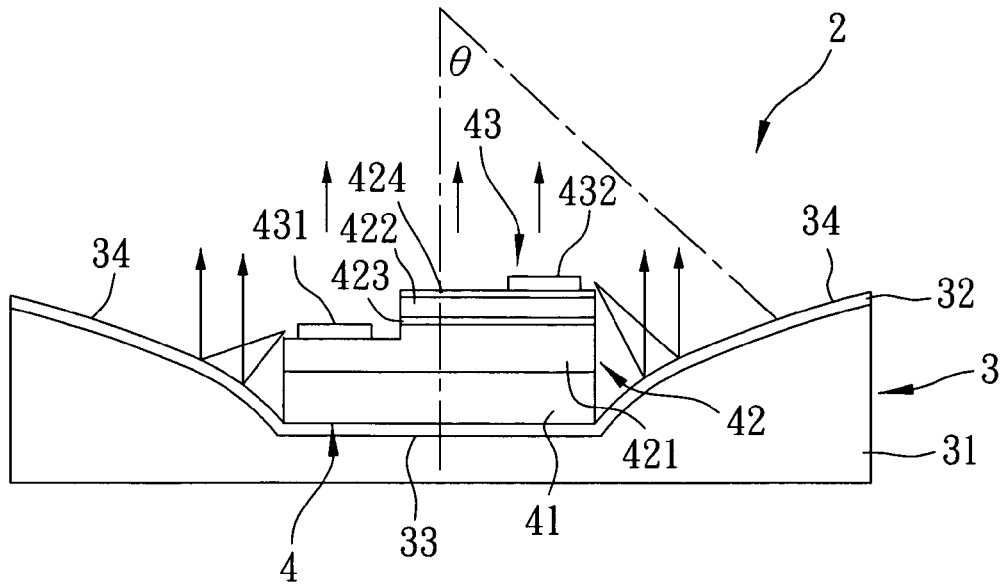
FIG. 2 is a cross-sectional view of an LED light emitter with heat sink holder according to a first embodiment of the present invention.

Referring to FIG. 2, an LED light emitter with heat sink holder 2 in accordance with a first embodiment of the present invention comprises a heat sink holder 3 and a light emitting diode (LED) chip 4 disposed on the heat sink holder 3. In one embodiment, merely one LED chip 4 is provided, and the LED chip 4 is, for instance, a horizontal conductive LED chip.

The heat sink holder 3 is made of material with high thermal conductivity coefficient, and has a base 31 formed of copper, gold, silver, nickel, tin, titanium, platina, palladium, tungsten, molybdenum and etc., or the alloy with elements selected from the above. A reflecting mirror 32 is made of high reflective coefficient material and is provided on the base 31. The reflecting mirror 32 includes a central portion 33 and a reflecting portion 34 surrounding the central portion 33. The LED chip 4 is integrally formed on the central portion 33. The normal of a top surface of the reflecting portion 34 forms an acute angle with respect to the normal of a top surface of the central portion 33. The top surface of the reflecting portion 34 is a smooth curved surface and substantially protrudes reverse to a bottom of the heat sink holder 3, whereby light is reflected for concentrative emission.

The LED chip 4 is unitarily connected with the heat sink holder 3. The LED chip 4 has a substrate 41 connecting with the top surface of the central portion 33, a light emitting film 42 for emitting light by photoemission, and an electrode unit 43 connecting with and Ohmic contacting the light emitting film 42 for supplying power for the light emitting film 42. The light emitting film 42 comprises a first coating layer 421 and a second coating layer 422 respectively doped to form different n-type or p-type, an active layer 423 between the first coating layer 421 and the second coating layer 422, and a transparent conductive layer 424. The active layer 423 serves as a carrier barrier relative to the first coating layer 421 and the second coating layer 422. The transparent conductive layer 424 is made of transparent and conductive metal oxide. For example, the transparent conductive layer 424 is made of indium and tin oxide, and is formed on the second coating layer 422. The electrode unit 43 includes a first electrode 431 on the first coating layer 421 and a second electrode 432 on the transparent conductive layer 424. The first electrode 431 and the second electrode 432 respectively electrically connect with electrical connecting wires (not shown) for supplying power to the light emitting film 42, whereby the LED chip 4 is able to emit light.

Figure 1:
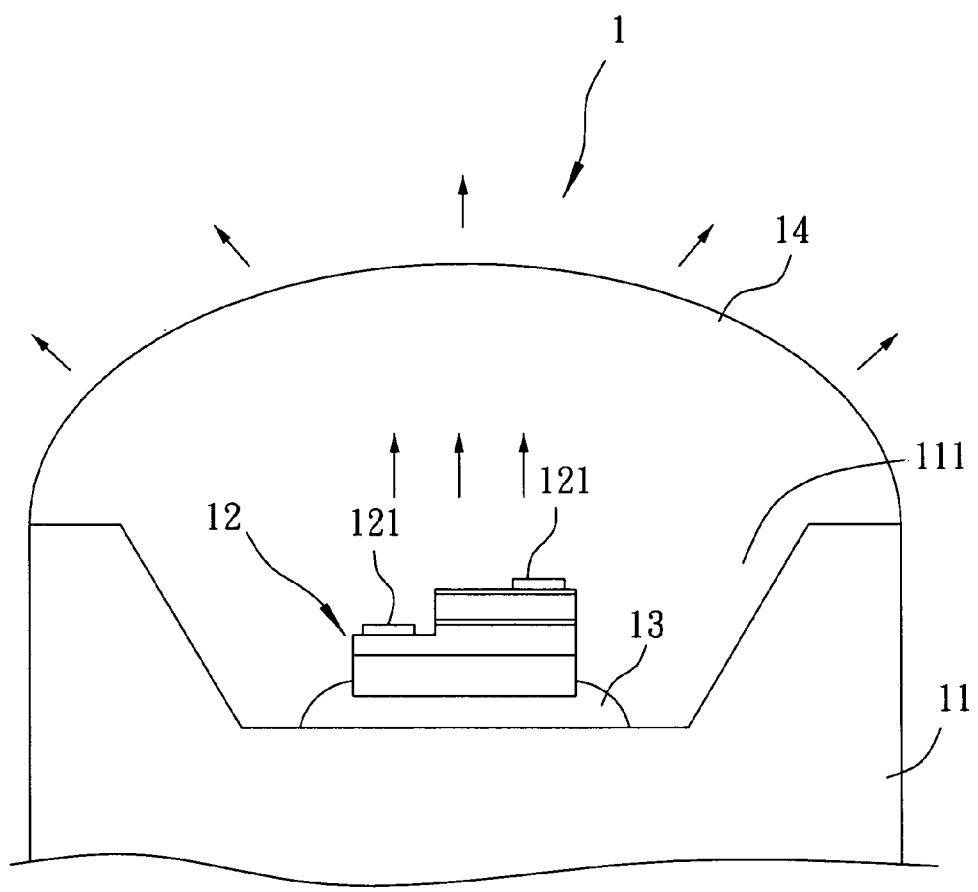
FIG. 1 is a cross-sectional view of a conventional LED light emitter.

When the first electrode 431 and the second electrode 432 supply power to the LED chip 1 through the electrical connecting wires, current flows through the light emitting film 42. The light emitting film 42 generates light due to electrons/holes recombination. Most light moving upward directly emits toward the external. While other light not moving positively is reflected by the reflecting mirror 32 of the heat sink holder 3, and is concentratively reflected and then positively emits toward the external since the top surface of the reflecting portion 34 is a smooth curved surface. Therefore, the light emitter 2 has high luminescence performance. The LED chip 4 generates internal heat companying with emitting light. The internal heat of the LED chip 4 directly passes through the heat sink holder 3 to go away from the LED chip 4. Compared to prior art, the LED light emitter 2 of the present invention avoids light passing through a connecting portion 13 which is used to glue the LED chip 12 in FIG. 1. As a result, the present invention can dissipate heat more quickly and more effectively, assuring operation of the LED chip 4 stably and efficiently, and therefore enhancing luminescence performance of the LED light emitter and lengthening work duration thereof.

Figure 3:
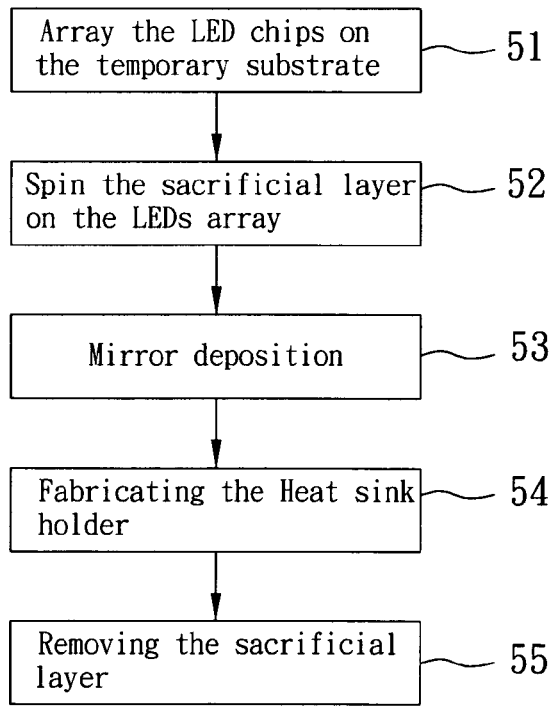
FIG. 3 is a flow chart of a method for manufacturing the LED light emitter with heat sink holder of FIG. 2.

FIG. 3 illustrates a method for manufacturing the LED light emitter with heat sink holder 2, which is interpreted more explicitly below.

Referring to FIG. 3, the first step is arrayed LEDs chips on the temporary substrate step 51. An LED chip 4 is preliminarily formed, which includes at least a substrate for epilayer growth 41, a light emitting film 42 on the substrate 41, and an electrode unit 43 connecting with and Ohmic contacting the light emitting film 42. Notably, the first step is suitable for a single LED chip, several separate LED chips, or mass LED chips by wafer production. The production methods for single LED chip, several separate LED chips, or mass LED chips are well know to the ordinary skilled persons in the art, need not be described herein.

Figure 4:
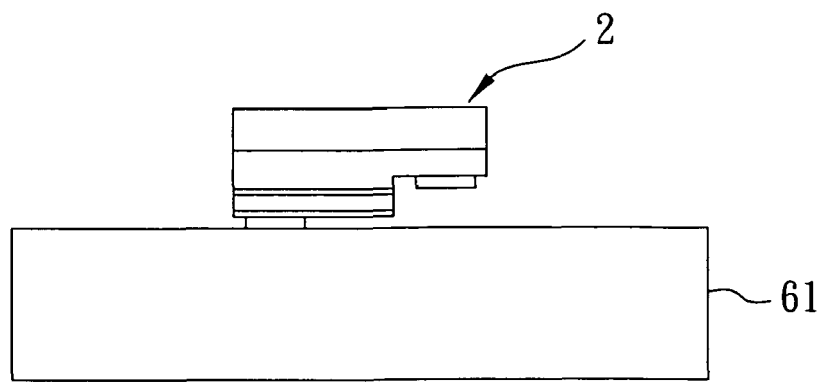
FIG. 4 is a cross-sectional view of a semi-manufactured LED light emitter with heat sink holder according to the method of FIG. 3, showing chip setting.

Further referring to FIG. 4, the chip setting step 52 comprises putting the LED chip 4 on a support portion 61 in such a way that the light emitting film 42 facing to the support portion 61. For example, the support portion 61 is a glass substrate.

Figure 5:
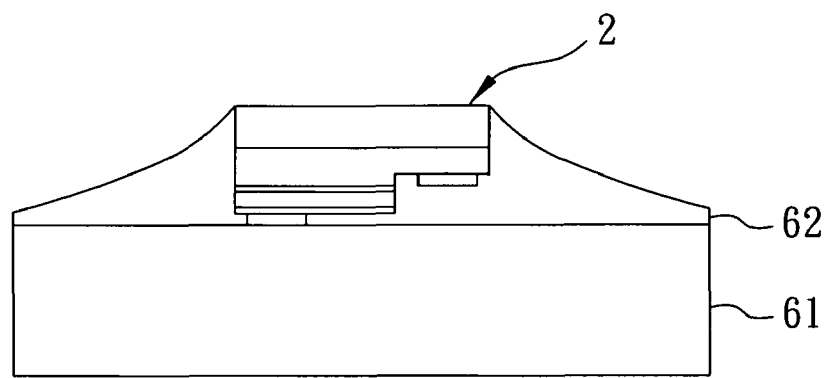
FIG. 5 is a cross-sectional view of a semi-manufactured LED light emitter with heat sink holder according to the method of FIG. 3, showing sacrificial layer forming step.

Referring to FIGS. 3 and 5, the sacrificial layer forming step 53 comprises putting macromolecule polymer, for example sensitive light-resistance material, on the support portion 61 and around a peripheral of the LED chip 4 to form a removable sacrificial layer 62. During the sacrificial layer forming step, thickness of the sacrificial layer 62 continuously reduces along a smooth concave surface from a top of the LED chip 4 to the support portion 61 by means of controlling speed of rotating coating process.

Figure 6:
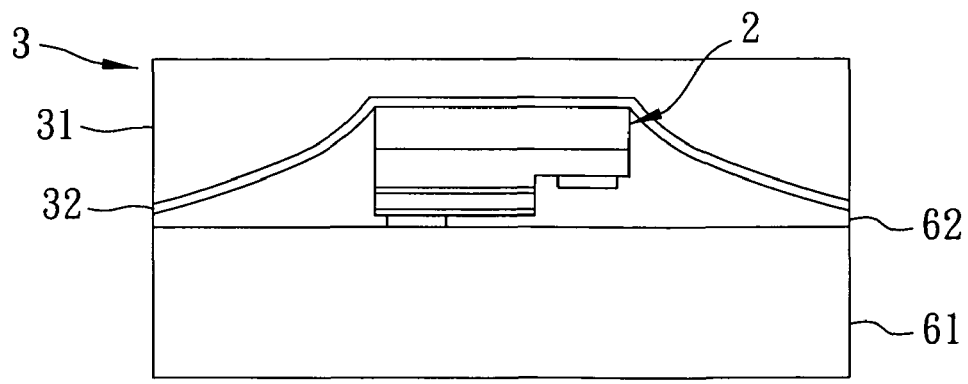
FIG. 6 is a cross-sectional view of a semi-manufactured LED light emitter with heat sink holder according to the method of FIG. 3, showing heat sink holder forming step.

Referring to FIGS. 3 and 6, the heat sink holder forming step 54 comprises forming a reflecting mirror 32 from the substrate 41 of the LED chip 4 up to the sacrificial layer 62 with material of high light reflectivity coefficient and high thermal conductivity coefficient by physically coating. Sequentially, high thermal conductivity material is coated incrementally upward on the reflecting mirror 32 by electrically coating to form a base 31. The reflecting mirror 32 and the base 31 together forms a heat sink holder 3 which has a top surface substantially parallel to a bottom surface of the substrate 41.

The final step is sacrificial layer removing step 55, which comprises etching the sacrificial layer 62 to form the LED light emitter with heat sink holder 2.

Preferably, in the heat sink holder forming step 54, the reflecting mirror 32 may be formed with at least two film portions which are arranged in such a way that a film portion of relatively high refractive index is overlapped with a film portion of relatively low refractive index, thereby further improving light reflection. The base 31 may be formed by electrical coating (with power or without power) or by vacuum coating.

Figure 7:
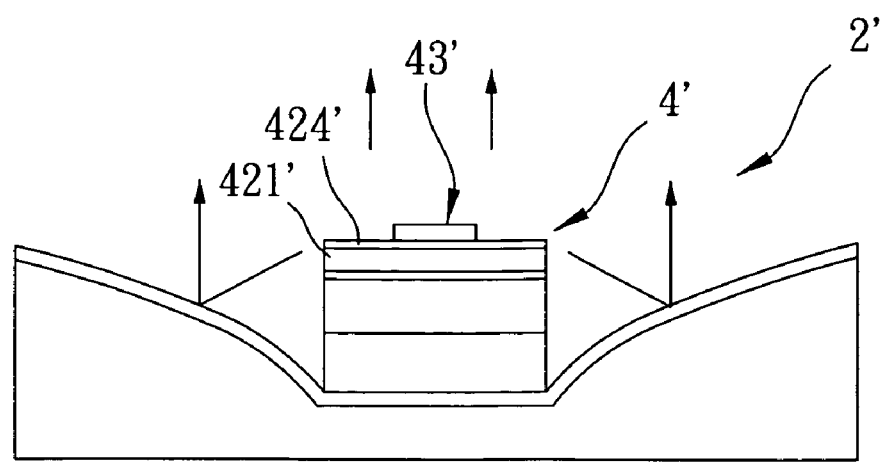
FIG. 7 is a cross-sectional view of an LED light emitter with heat sink holder according to a second embodiment of the present invention.

Referring to FIG. 7, according to a second embodiment of the present invention, an LED light emitter 2' is similar to the LED light emitter 2 of the first embodiment of the present invention except an LED chip 4' of the LED light emitter 2'. The LED chip 4' is a vertical conductivity LED chip. So an electrode unit 43', and connection between a transparent conductive layer 424' and a first coasting layer 421' are distinguished from the horizontal conductive LED chip 4 of the first embodiment. The horizontal conductive LED chip 4 and the vertical conductivity LED chip 4' are both well know to the art and are not the vital spirit of the invention. Therefore more detailed description of the LED chip is omitted. The method for manufacturing the LED light emitter 2' according to the second embodiment is similar to the method for manufacturing the LED light emitter 2 according to the first embodiment except for chip manufacturing step. The method for manufacturing the LED light emitter 2 according to the first embodiment produces a horizontal conductive LED chip 4 in the chip manufacturing step, while the method for manufacturing the light emitter 2' according to the second embodiment produces a vertical conductive LED chip 4' in the chip manufacturing step.

More changes or variation may be made to the present invention without escaping from the spirit of the present invention. For example, a plurality of LED chips 4, 4' are provided on the central portion 33 of the heat sink holder 3, enhancing luminance of the LED light emitter. In another embodiment, the LED chips 4, 4' are of different wavelengths. The LED light emitter may emit mixed lights, especially white light. In another embodiment, a plurality of LED chip 4, 4' which emit single light are together provided on one LED light emitter, enhancing luminance of the light emitter. In another embodiment, a plurality of LED chip 4, 4' which emit mixer light are together provided on one LED light emitter. Such changes all belong to the scope of this invention.

It is understood that the invention may be embodied in other forms without departing from the spirit thereof. Thus, the present examples and embodiments are to be considered in all respects as illustrative and not restrictive, and the invention is not to be limited to the details given herein.

The invention claimed is:

1. A method for manufacturing an LED light emitter with a heat sink holder, comprising:
    a chip setting step, putting and fixing an LED chip on a support portion in such a way that a light emitting plane of the LED chip faces to the support portion, wherein the LED chip includes a substrate, a light emitting film on the substrate for generating light by photoemission, and an electrode unit connecting with and Ohmic contacting the light emitting film for supplying power for the light emitting film;
    a sacrificial layer forming step, forming a removable sacrificial layer on the support portion and around a peripheral of the LED chip, a thickness of the sacrificial layer being continuously reduced from the substrate of the LED chip to the support portion;
    a heat sink holder forming step, forming the heat sink holder from a bottom of the LED chip to the sacrificial layer with a material of high thermal conductivity coefficient, the heat sink holder having a top surface substantially parallel to a bottom surface of the substrate; and
    a sacrificial layer removing step, including removing the support portion and the sacrificial layer to form the LED light emitter with the heat sink holder.

2. The method for manufacturing the LED light emitter with the heat sink holder as recited in claim 1, further comprising a chip manufacturing step for preliminarily forming the LED chip, the LED chip including the substrate, the light emitting film on the substrate for generating light by photoemission, and the electrode unit connecting with and Ohmic contacting the light emitting film for supplying power for the light emitting film.

3. The method for manufacturing the LED light emitter with the heat sink holder as recited in claim 1, wherein the thickness of the sacrificial layer is continuously reduced along a smooth concave surface from the substrate of the LED chip to the support portion.

4. The method for manufacturing the LED light emitter with the heat sink holder as recited in claim 1, wherein the heat sink holder forming step comprises forming a reflecting mirror from a bottom of the substrate of the LED chip to the sacrificial layer with a material having a high light reflectivity coefficient and high thermal conductivity coefficient, sequentially forming a base coated incrementally upward on the reflecting mirror having a high thermal conductivity material, the reflecting mirror and the base together forming the heat sink holder.

5. The method for manufacturing the LED light emitter with the heat sink holder as recited in claim 4, wherein the reflecting mirror is formed with at least two film portions which are located in a manner that a film portion of a relatively high refractive index is overlapped with a film portion of a relatively low refractive index.

6. The method for manufacturing the LED light emitter with the heat sink holder as recited in claim 4, wherein the base is formed incrementally by electrical coating.

\* \* \* \* \*